United States Patent [19]
Hansson et al.

[11] Patent Number: 5,404,276
[45] Date of Patent: Apr. 4, 1995

[54] SCREENED RFI THROUGH-LET

[75] Inventors: Kjell O. Hansson, Sollentuna; Erik L. Ovanfors, Stockholm, both of Sweden

[73] Assignee: Telefonaktiebolaget L M Ericsson, Stockholm, Sweden

[21] Appl. No.: 951,121

[22] Filed: Sep. 25, 1992

[30] Foreign Application Priority Data

Sep. 27, 1991 [SE] Sweden ................. 9102822

[51] Int. Cl.⁶ ............................................. H05K 9/00
[52] U.S. Cl. ................................. 361/821; 174/35 R; 174/35 GC; 174/35 TS; 174/51; 248/27.1; 361/825; 439/108; 439/607
[58] Field of Search .......... 174/35 R, 35 GC, 35 TS, 174/51; 248/27.1–27.3; 361/807, 809, 818, 819, 821, 825; 439/92, 108, 552, 557, 607

[56] References Cited

U.S. PATENT DOCUMENTS

| | | | |
|---|---|---|---|
| 3,168,612 | 2/1965 | Sorenson | 439/557 |
| 4,824,398 | 4/1989 | Taylor | 439/557 |
| 4,840,584 | 6/1989 | Cox | 439/572 |
| 4,901,205 | 2/1990 | Landis et al. | 361/818 |

FOREIGN PATENT DOCUMENTS 3843948 7/1990 Germany ................. 439/557

Primary Examiner—Leo P. Picard
Assistant Examiner—Donald A. Sparks
Attorney, Agent, or Firm—Burns, Doane, Swecker & Mathis

[57] ABSTRACT

An RFI through-let for screening signals transmitted between different components, for instance circuit boards, of which one component is arranged in a screened space, includes signal-transmission through-let capacitors which are mounted in a screen plate intended to be positioned in a rectangular opening in the sidewall of the screened space. The screen plate is comprised of a front part which includes a rectangular, generally flat plate having tongues or tabs disposed along the sides thereof and also having a central, rectangular hollow, and a holding part which is soldered firmly in the vicinity of the hollow of the front part. The holding part includes a flat plate whose long sides are bent to form guide flanges which extend perpendicularly downwards away from the front part, along a first line corresponding to the long sides of the opening, and along a second line downwardly of the first line are further bent inwardly towards one another. Parts punched-out along the first line cause shoulders to be formed that project upwards and outwards towards the front part and are intended to grip-in behind the sidewall of the space when fitting the screen plate and therewith hold the screen plate firmly in the opening.

4 Claims, 1 Drawing Sheet

1

SCREENED RFI THROUGH-LET

TECHNICAL FIELD

The present invention relates to a RFI through-let for screening signals transmitted between different components, for instance circuit boards, of which components one is mounted in a screened space, comprising signal-transmission through-let capacitors which are mounted in a screening plate intended to be mounted in a rectangular opening in the side wall of the screened space.

BACKGROUND ART

Screened RFI-signal through-lets (RFI=Radio Frequency Interference) of the aforesaid kind are known to the art. These through-lets, however, are often of complicated construction and the work involved in fitting the actual through-let and in mounting the through-let in the associated equipment is time-consuming. As a result, difficulties arise in achieving a complete screen around the through-let, and also results in problems of keeping the through-let in position in the screen wall.

DISCLOSURE OF THE INVENTION

The object of the present invention is to provide a screened RFI through-let of the aforesaid kind which is of simple and reliable construction, which can be fitted without requiring time-consuming procedures, and which can be applied simply and quickly and which will remain seated in the opening, while nevertheless affording a fully safe screen. This is achieved with a through-let having the characteristic features set forth in the following Claims.

Thus, the advantages afforded by the inventive through-let reside in a simple construction comprising only a few parts, reliable screening, and rapid fitting and application.

Further objects of the invention and advantages afforded thereby will be apparent from the following description, in which the invention is described in more detail with reference to a preferred exemplifying embodiment thereof and also with reference to the accompanying drawing.

BEST MODE OF CARRYING OUT THE INVENTION

Figure 1:
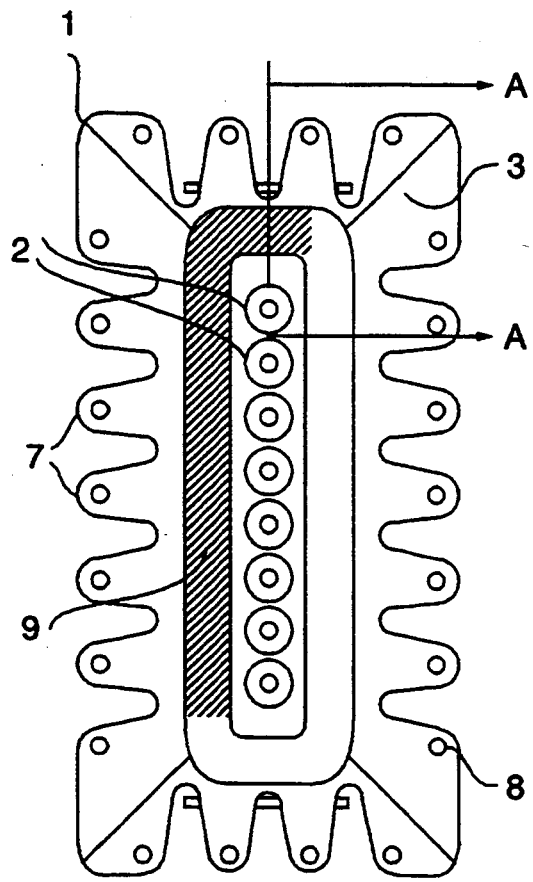
FIG. 1 is a top view of an inventive RFI through-let.

FIG. 1 is a top view of the inventive RFI through-let. The through-let includes a screen plate 1 in which a number of signal-transmission through-let capacitors 2 are mounted. The capacitors 2 are connected to electronic components, such as circuit boards, in a suitable manner, of which components one is mounted in a screened space. The described and illustrated embodiment has eight capacitors, although it will be understood that this number can be varied in accordance with the requirement for necessary signal transmissions.

Figure 2:
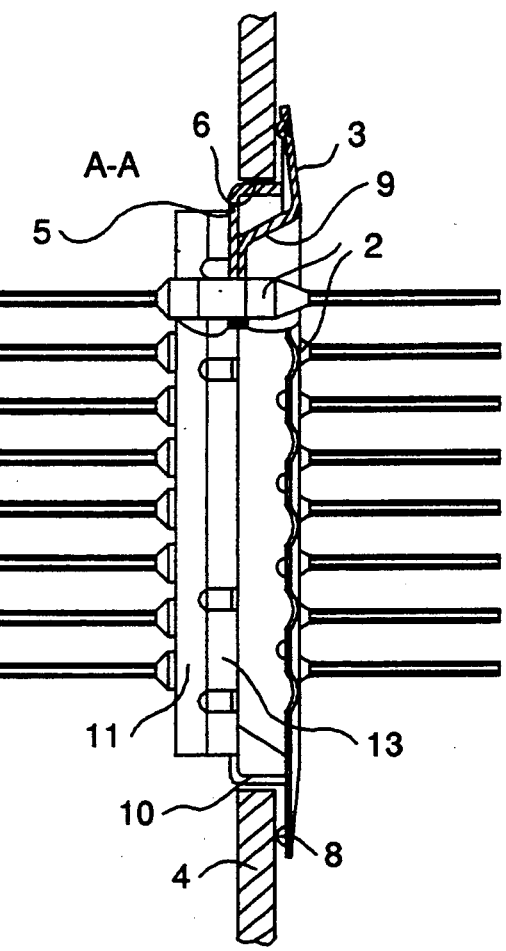
FIG. 2 illustrates the through-let in side view and partially in section, and shows the through-let mounted in a chassis.
Figure 3:
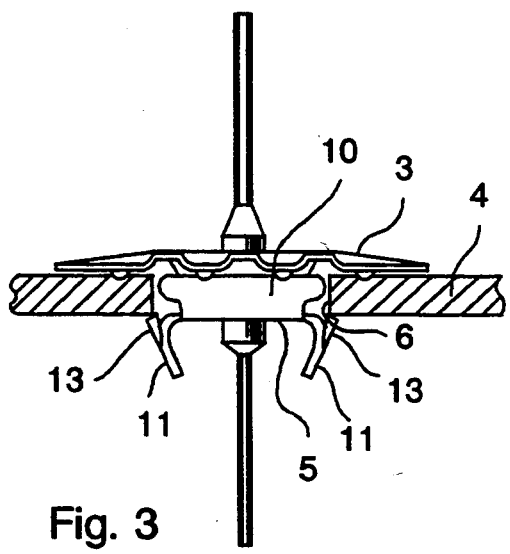
FIG. 3 is another side view of the through-let.
Figure 4:
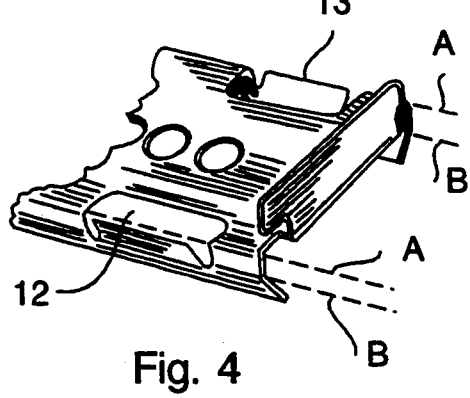
FIG. 4 illustrates a detail of the through-let.

The screen plate 1 is comprised of two parts, a front part 3 which lies against the side-wall 4 of the screened space, and a holding part 5 which holds the through-let in position in an opening 6 in the side-wall of the space, see FIGS. 2 and 3. The front part comprises a rectangular, generally flat plate having disposed along the sides thereof tabs or tongues 7 which lie in resilient, screening contact with the side-wall 4. Contact with the side-wall can be improved by providing the tongues 7 with projections or beads 8. The plate is provided with a central hollow 9 which has disposed in the flat bottom thereof a number of holes, the number corresponding to the number of signal transmission capacitors 2.

The holding part 5 comprises a rectangular flat plate whose two opposing short-sides have been bent "up" at right angles against the front part 3 when the screen plate 1 is fitted, to form positioning flanges 10 which determine the position of the screen plate longitudinally in the opening 6, as illustrated in FIG. 2. As will be seen from FIG. 3, the long sides of the holding part 5 are first bent "down" at right angles along a line A corresponding to the long sides of the opening 6 away from the front part, and are thereafter further bent, slightly inwards towards one another along a line B to form guide flanges 11 which guide the screen plate 1 in the opening when fitting the through-let. Two U-shaped parts 12 punched-out along the line A on each long side cause shoulders 13 to be formed when bending along the line B, these shoulders projecting obliquely upwards and outwards in relation to the front part 3. The shoulders 13 are adapted to snap-in behind the side-wall 4 of the space when fitting the screen plate 1, and to hold the screen plate in position in the opening 6. The holding part 5 is also provided with a number of holes corresponding to the number of signal transmission capacitors 2.

The screen plate 1 is assembled by soldering together the front part 3 and the holding part 5, with the holes in respective parts coinciding with one another, whereafter the signal transmission capacitors 2 are mounted in the holes and soldered therein. The screen plate is fitted by placing the screen plate in the opening 6, wherein the guide flanges 11 guide the screen plate laterally and the positioning flanges guide the plate longitudinally. The shoulders 13 snap-in behind the side-wall 4 and hold the screen plate firmly in position.

It will be understood that the invention is not restricted to the aforedescribed and illustrated embodiment thereof, and that modifications can be made within the scope of the following Claims.

What is claimed is:

1. An RFI through-let for screening signals transmitted between components, of which one is arranged in a screened space, comprising through-let capacitors for signal transmission mounted in a screen plate for positioning in a rectangular opening in a side-wall of the screened space, wherein the screen plate comprises a front part which includes a rectangular, generally flat plate having tabs disposed along the sides thereof and having a central, rectangular hollow, and further comprises a holding part soldered to the hollow which includes a flat plate whose long sides are bent to form right-angled guide flanges which extend down from the front part along a first line corresponding to the long sides of the opening and which are bent further along a second line downwardly of the first line inwards towards one another, the right-angled flanges having shoulder portions punched-out along the first line, the shoulder portions projecting upwardly and outwardly towards said front part for gripping behind the side-wall when fitting the screen plate and holding the screen plate firmly in said opening.

2. A through-let according to claim 1, wherein the front part and the holding pan have mutually coinciding holes in which the through-let capacitors are soldered.

3. A through-let according to claim 1, wherein the tabs have beads which face towards the side-wall.

4. A through-let according to claim 1, wherein the holding part is bent upwards at its short sides towards the front part to form positioning flanges which determine the longitudinal position of the screen plate in the opening.

* * * * *